(12) United States Patent
Martin et al.

(10) Patent No.: US 8,514,122 B2
(45) Date of Patent: Aug. 20, 2013

(54) ANALOG-DIGITAL CONVERSION SYSTEM COMPRISING A DOUBLE AUTOMATIC GAIN CONTROL LOOP

(75) Inventors: Nicolas Martin, Bourg les Valence (FR); Jean-Michel Perre, St Peray (FR); David Depraz, Valence (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 13/446,571

(22) Filed: Apr. 13, 2012

(65) Prior Publication Data

US 2013/0099952 A1    Apr. 25, 2013

(30) Foreign Application Priority Data

Apr. 14, 2011 (FR) .................................... 11 01162

(51) Int. Cl.
*H03M 1/12*    (2006.01)
(52) U.S. Cl.
USPC ........... 341/155; 341/140; 341/146; 714/795; 455/266; 455/234.1; 455/226.1; 455/562.1; 375/376; 375/229; 375/345; 375/130; 375/232
(58) Field of Classification Search
USPC .................. 341/140–155; 375/130, 136, 142, 375/147, 219, 229, 232, 345, 346; 455/266, 455/226.2, 234.1, 562.1; 333/18
See application file for complete search history.

(56) References Cited

U.S. PATENT DOCUMENTS

| | | | | |
|---|---|---|---|---|
| 5,241,562 A * | 8/1993 | Partyka et al. | ................. | 375/142 |
| 5,265,125 A * | 11/1993 | Ohta | ............................. | 375/229 |
| 5,365,550 A * | 11/1994 | Roberson | ..................... | 375/150 |
| 5,453,866 A * | 9/1995 | Gross | ............................ | 398/110 |
| 5,630,220 A * | 5/1997 | Yano | ........................... | 455/234.1 |
| 5,640,385 A * | 6/1997 | Long et al. | ..................... | 370/335 |
| 5,652,594 A * | 7/1997 | Costas | .......................... | 342/162 |
| 5,703,910 A * | 12/1997 | Durvaux et al. | ............... | 375/322 |
| 5,710,799 A * | 1/1998 | Kobayashi | ..................... | 375/349 |
| 5,784,410 A * | 7/1998 | Nakano | ......................... | 375/345 |
| 5,825,818 A * | 10/1998 | Kaku et al. | ..................... | 375/232 |
| 7,324,037 B1 * | 1/2008 | Tan et al. | ...................... | 341/155 |
| 7,589,657 B2 * | 9/2009 | Tan et al. | ...................... | 341/155 |
| 2002/0163979 A1 | 11/2002 | Takatz et al. | | |
| 2006/0220935 A1 | 10/2006 | Hughes et al. | | |

FOREIGN PATENT DOCUMENTS

WO    2004/047323 A1    6/2004

* cited by examiner

*Primary Examiner* — Lam T Mai
(74) *Attorney, Agent, or Firm* — Baker & Hostetler LLP

(57) ABSTRACT

An analog-digital conversion system comprising at least one variable gain amplifier amplifying an input signal e, an analog-digital converter CAN digitizing said signal e, an interference-suppressing digital processing module, processing the digitized signal, also comprises a first automatic gain control AGC loop, called the analog AGC loop, that compares an estimate of the output power of the CAN converter with a control setpoint g1 called the control setpoint of the analog AGC loop, a gain ga used to control the variable gain amplifier being deduced from this comparison. The system also comprises a second automatic gain control AGC loop called the digital loop, said digital loop comparing an estimate of the power after the interference-suppressing digital processing with a predetermined control setpoint gn, the analog AGC loop being controlled by a control setpoint deduced from this comparison.

16 Claims, 7 Drawing Sheets

ANALOG-DIGITAL CONVERSION SYSTEM COMPRISING A DOUBLE AUTOMATIC GAIN CONTROL LOOP

CROSS-REFERENCE TO RELATED APPLICATION

This application claims priority to foreign French patent application No. FR 1101162, filed on Apr. 14, 2011, the disclosure of which is incorporated by reference in its entirety.

FIELD OF THE INVENTION

The invention relates to an analog-digital conversion system comprising a double automatic gain control loop and is applied notably to the field of radio communications.

BACKGROUND

In a receiver of digital radio communications, the demodulation of the signals is carried out in digital. Before carrying out this demodulation, an analog stage of the receiver brings the signal around an intermediate frequency. The objective of this analog stage is to amplify the signal and to filter it with the aid of an antialiasing filter. After filtering, the signal is digitized using an analog-digital converter usually given the acronym CAN.

In the nominal receiving conditions with no interference, the analog-digital conversion of an analog signal needs only a reduced number N of bits. This makes it possible to limit the complexity of the digital processings carried out on the digitized signal. If the power of the signal at the input of a CAN converter is set to the maximum possible conversion efficiency R, the loss introduced by the digitization is limited. For N=3, the loss due to the digitization does not exceed 0.2 dB. The conversion efficiency R is the ratio between the signal-to-noise ratio before conversion and the signal-to-noise ratio after conversion.

In order to control the gain of the analog chain so as to have a maximum efficiency of the CAN converter, an adaptive gain control loop AGC, also called the automatic gain control loop, is usually used. FIG. 1 gives an example of the receiving chain comprising a AGC loop. This receiving chain comprises an analog stage 113 and a digital stage 114. The analog stage comprises notably a variable gain amplifier 100 having as its objective the amplification of an analog input signal e. After amplification, the signal is inserted into a CAN converter 101 on N bits. The digitized signal corresponds to a succession of digital samples encoded on N bits. It is filtered with the aid of an interference-suppressing digital filter 107, for example of the finite impulse response FIR filter type. The bits at the output of the filter are rescaled 108 that is to say encoded on a smaller number of bits, the rescaling operation usually being called "bit rescaling". The signal thus digitized, filtered and rescaled is then used for demodulating the transmitted communication channel(s) 108, 109, 110, 111, 112. As an example, the GNSS (Global Navigation Satellite System) radio navigation systems usually use broadband signals generated using the spread-spectrum technique. In this case, a communication channel is associated with a spread code.

In order to control the amplitude of the analog signal at the input of the CAN converter, the AGC loop 102 comprises a module 103 for determining the power at the output of said converter and/or the mean of this power and compares it 104 with a control setpoint g1. The difference between the measured power and the setpoint is used by a corrector 105 in order to determine an analog gain ga 106 to be applied to the variable gain amplifier 100 of the analog stage 113. The corrector consists in applying a gain to said difference before supplying an infinite integrator, never reset to zero. The choice of the control setpoint g1 depends on the optimal efficiency value R for the conversion. The choice of the gain determines the time constant of the AGC loop.

If interference affects the input signal e, the latter must be taken into account by the digital stage 114, but also at the time of the analog-digital conversion 101.

As explained above, the role of the AGC loop is to control the amplification gain introduced by the analog stage so as to make the best use of all of the encoding amplitude of the CAN converter while preventing saturation. Thus the ratio of the useful signal power contained in the received signal over the power of the quantization noise is maximized.

The programming of the AGC loop may be adapted so as to take account of the type of interference that affects the signal. Thus, the AGC loop may be programmed to use a low encoding or a high encoding. There are three types of interference affecting a signal. The first type corresponds to the continuous narrowband interference, the second type corresponds to the pulsed narrowband interference and the third type corresponds to the broadband interference.

Continuous narrowband interference is interference that continuously affects a portion of the band occupied by the useful signal. In this case, a band-stop digital filter makes it possible to eliminate the corrupted frequencies without irremediably damaging the useful signal occupying a broader spectrum. Since the useful signal is spread over a broad band, there remains enough useful signal to be demodulated. For the digital filtering to be effective in the presence of interference, it is necessary to digitize the received signal with a large number of bits, for example with N>6. Specifically, the CAN converter introduces a quantization noise which has to be minimized because this noise is uniformly distributed throughout the sampled band. It can therefore not be eliminated by digital filtering. For the ratio of the useful signal power over the quantization noise power to be maximum, the power of the signal at the input of the CAN converter must occupy the whole range of said converter yet without saturating it. For this, the AGC loop is programmed using a high encoding. FIG. 2 illustrates the ways in which the analog input signal can be adapted to the range of the CAN converter.

The power of the input signal must not exceed a saturation limit 205 specific to the converter. A high encoding signifies that a high control setpoint g1 204 is chosen so that the power of the signal at the input of the converter is as close as possible to the saturation limit 205 while ensuring a saturation margin 202. So long as the total power of the received signal is continuous, the controlling of the AGC loop in high encoding ensures an optimal conversion without saturation and with a maximum signal power ratio over quantization noise.

The pulsed narrowband interference is intermittent interference that affects only a portion of the band occupied by the useful signal. Faced with this type of interference, the AGC loop does not have the time to react to control the range of the signal at the input of the analog-digital converter. There is saturation and the consequence of this saturation is that the interfering power is spread throughout the band. In this case, the digital filtering becomes inoperative and a corrupted signal is found at the output. This is why it is preferable in this case to use a low encoding for the AGC loop. In other words, a low setpoint 203 of AGC is chosen in order to retain a maximum saturation margin for the pulsed interference. The power of the input signal must be sufficiently great relative to the quantization noise 206. For this, the input signal is adapted by taking account of a quantization margin 201 so as not to substantially degrade the signal-to-noise ratio after digital conversion. A low encoding signifies that a low setpoint g1 203 is chosen so that the power of the signal at the input of the converter is as low as possible while ensuring a sufficient quantization margin 201. The drawback of low encoding is that, in the presence of narrowband continuous interference, the quantization noise level rises relative to the useful signal level.

In the presence of narrowband interference, the reception performance therefore depends on the choice between high encoding 204 and low encoding 203, that is to say on the choice between a high setpoint for the best processing of the continuous narrowband interference and a low setpoint for the pulsed narrowband interference.

The broadband interference is interference that occupies the whole useful band of the signal. A band-stop digital filter therefore does not make it possible to sort between the frequencies corrupted by this interference and those that are not. In this case, the choice of a high encoding or of a low encoding is of no importance.

Moreover, when there is too much pulsed interference, the mean power at the output of the CAN converter increases. This has the effect of reducing the amplification gain ga by the retroaction 106 of the AGC loop and therefore of raising the level of quantization noise relative to the useful signal.

FIG. 3 illustrates an existing technique making it possible to prevent this phenomenon. The transmission chain of FIG. 3 comprises an analog stage consisting of a variable gain amplifier 300 having the objective of amplifying an analog input signal e. After amplification, the signal is inserted into a CAN converter 301 on N bits. The digitized signal is filtered with the aid of an interference-suppressing digital filter 307. The bits at the output of the filter are rescaled 308 on M bits. The signal is then used to demodulate the received communication channel(s) 308, 309, 310, 311, 312. In order to control the range of the analog signal at the input of the CAN converter 301, a AGC loop 302 determines 303 a signal power, compares 304 this power with a control setpoint g1 and determines a difference between this power and the setpoint g1. A corrector 305 is then used to determine the analog gain ga to be applied 306 to the variable gain amplifier 300. In contrast with the reception chain shown in FIG. 1, the AGC loop 302 is based on the signal at the output of the interference-suppressing filter 307 cleared of the narrowband interference in order to estimate 303 the power.

The drawback of this solution is that there is no control of the power at the output of the CAN converter 301. Therefore, in the event of powerful continuous narrowband interference, the CAN converter 301 begins to saturate before the AGC loop 302 reacts. After saturation, the interference spread throughout the band reappears at the output of the interference-suppressing filter, the loop reacts too late. The use of the output signal of the interference-suppressing filter to estimate the power used in the AGC loop 302 makes it possible to indirectly control the power of the signal excluding interference at the input of said filter because the relationship between the input power and the output power is known in the case of a white noise. Nevertheless, this does not make it possible to control what happens at the input of the CAN converter 301, in particular the risks of saturation.

SUMMARY OF THE INVENTION

One object of the invention is notably to alleviate the aforementioned drawbacks.

Accordingly, the subject of the invention is an analog-digital conversion system comprising at least one variable gain amplifier amplifying an input signal e, an analog-digital converter CAN digitizing said signal e, an interference-suppressing digital processing module for processing the digitized signal. It also comprises a first automatic gain control (AGC) loop, called the analog AGC loop, comparing an estimate of the output power from the CAN converter with a control setpoint g1 called the control setpoint of the analog AGC loop, a gain ga used to control the variable gain amplifier being deduced from this comparison. It also comprises a second automatic gain control AGC loop called the digital loop, said digital loop comparing an estimate of the power after the interference-suppressing digital processing with a predetermined control setpoint gn, the analog AGC loop being controlled using the result of this comparison.

According to one aspect of the invention, the setpoint of the analog AGC loop is deduced from the result of the comparison made by the digital AGC loop between the estimate of the power at the output of the interference-suppressing digital processing and the predetermined control setpoint gn.

The result of the comparison made by the digital AGC loop between the estimate of the power at the output of the interference-suppressing digital processing and the predetermined control setpoint gn is for example used to determine a gain, this gain being applied to the signal at the output of the CAN converter before estimation of the power of the signal.

According to another aspect of the invention, the power estimates used by the analog and digital AGC loops are mean power estimates.

The control setpoint of the analog AGC loop may be determined by the digital AGC loop using a corrector, said corrector applying a gain to the result of the comparison and incorporating the signal samples thus obtained and in which the gain ga is determined by the analog AGC loop using a corrector, said corrector applying a gain to the result of the comparison and incorporating the signal samples thus obtained.

According to one aspect of the invention, a different time constant is used for the two AGC loops, the time constant of the analog AGC loop being chosen to have a duration that is less than the time constant of the digital AGC loop.

A corrector determines, for example, a setpoint g, a saturation module adapting this setpoint so as to obtain the control setpoint of the analog AGC loop g1 adapted such that:

| if g ≧ gmax | then | g1 = g1max |
| if g1min < g < g1max, | then | g1 = g |
| if g ≦ g1min | then | g1 = g1min | expressions in which:

g1min corresponds to the quantization margin of the CAN converter;

g1max corresponds to the saturation margin of the CAN converter.

As an example, the saturation module determines a second adapted setpoint g2 based on the setpoint g so that g2=g−g1, the gain g2 being applied to the output signal of the interference-suppressing digital processing.

Moreover, the invention proposes a pulse excision module is used after the interference-suppressing digital processing.

According to one advantageous embodiment of the invention, a nonlinearity module is used in the analog AGC loop after comparison, this module having the function of giving more weight to the signal when the latter is not disrupted, that is to say when the estimated power is lower.

A nonlinearity module is for example used in the digital AGC loop after comparison, this module having the function of giving more weight to the signal when the latter is not disrupted, that is to say when the estimated power is lower.

In one embodiment of the invention, several analog input signals e1, e2, e3 originating from several sensors are amplified and converted into digital signals, a variable gain amplifier and a CAN converter being associated with an input signal. These input signals, after having been amplified and digitized, are processed by an interference-suppressing digital processing module such that a signal resulting from a combination of the digitized signals is obtained, a digital AGC loop being used to determine a control setpoint G1 used by a plurality of analog AGC loops, an analog AGC loop being used for each input signal.

The interference-suppressing digital processing is for example a digital finite impulse response filter.

Alternatively, according to a variant embodiment, the interference-suppressing digital processing is an amplitude domain processing ADP.

Alternatively, according to a variant embodiment, the interference-suppressing digital processing is a spatial processing using a multi-sensor antenna or space-time adaptive processing STAP.

A rescaling module is, for example, used after the interference-suppressing digital processing.

The input signal is, for example, a broadband signal generated using the spread-spectrum technique.

BRIEF DESCRIPTION OF THE DRAWINGS

Other features and advantages of the invention will appear with the aid of the following description which is given as an illustration and is nonlimiting, and made with respect to the appended drawings amongst which.

DETAILED DESCRIPTION

Figure 4:
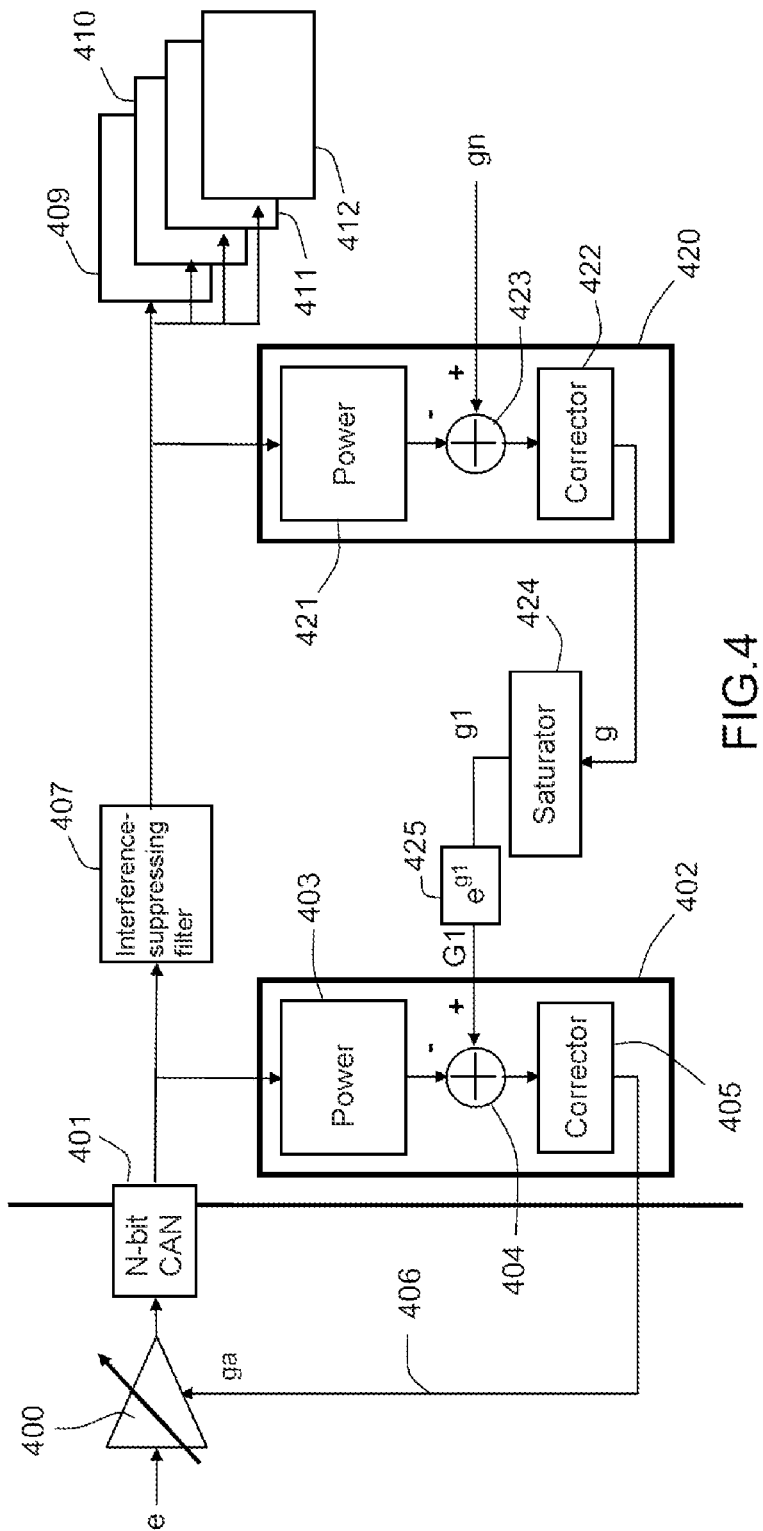
FIG. 4 shows a first embodiment of the analog-digital conversion system according to the invention.

FIG. 4 shows a first embodiment of the analog-digital conversion system according to the invention. The system consists of a transmission chain comprising an analog stage itself consisting of a variable gain amplifier 400. The object of this amplifier is to amplify an analog input signal e. After amplification, the signal is processed by a CAN converter 401 on N bits. The digitized signal at the output of the converter 401 is filtered with the aid of an interference-suppressing digital filter 407. The signal is then used to demodulate the received communication channel(s) 409, 410, 411, 412.

The analog-digital conversion system according to the invention uses two AGC loops 402, 420 in cascade. The first AGC loop 402 is a conventional analog AGC loop based on an estimate of power at the output of the CAN converter 401. The second AGC loop 420 is called a digital AGC loop based on an estimate of power at the output of the interference-suppressing filter 407 and of which the object is to determine the control setpoint of the first loop.

In order to control the range of the analog signal at the input of the CAN converter 401, the first, analog AGC loop 402 determines 403 the power of the signal at the output of the CAN converter 401 or a mean of this power, and compares it 404 with a control setpoint g1 corresponding to a power value and determines a difference of power level used by a corrector 405 to determine the analog gain ga to be applied 406 to the variable gain amplifier 400.

The control setpoint G1 of the analog AGC loop 402 is controlled by the second loop, that is to say the digital AGC loop 420 based on the signal at the output of the interference-suppressing filter. This second AGC loop 420 comprises means 421 for estimating the power of the signal after interference-suppressing filtering 407 or a mean of this power, means 423 for comparing this power with a power setpoint gn called the digital control setpoint and a corrector 422 the function of which is to generate a setpoint g on the basis of said comparison.

Figure 1:
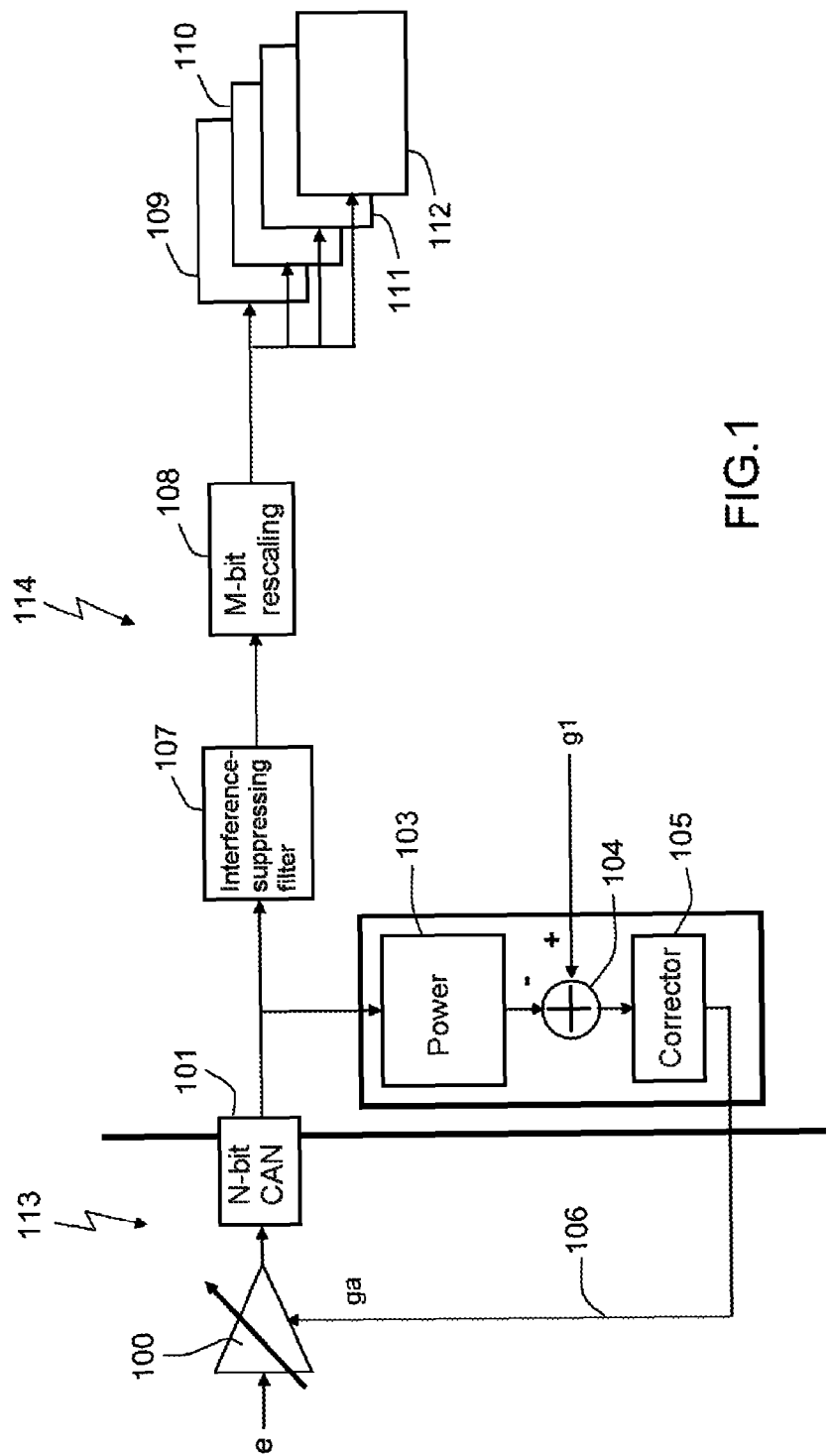
FIG. 1 gives an example of a reception chain comprising a AGC loop.
Figure 2:
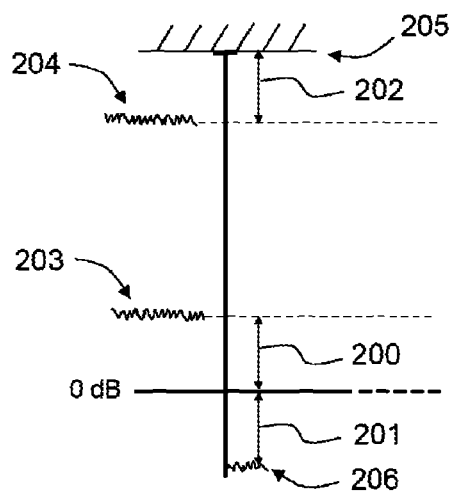
FIG. 2 illustrates how an analog input signal can be adapted to the range of a CAN converter.
Figure 5:
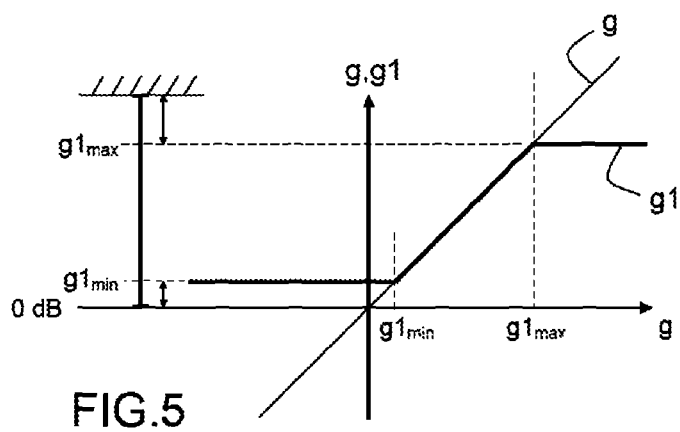
FIG. 5 illustrates the operation of a saturation module.

The setpoint g may be adapted to obtain an adapted setpoint g1 using a saturation module also called a saturator 424. The operation of this module may be described with the aid of FIG. 5 and of the following expressions:

| | | |
|---|---|---|
| $g \geq g\text{max}$ | $\Rightarrow$ | $g1 = g1\text{max}$ |
| $g1\text{min} < g < g1\text{max},$ | $\Rightarrow$ | $g1 = g$ |
| $g \leq g1\text{min}$ | $\Rightarrow$ | $g1 = g1\text{min}$ | g1min corresponds to the quantization margin of the CAN converter and g1max corresponds to the saturation margin of the CAN converter. As an example, the values of g1min and of g1max may be chosen in the following manner:

$$g1\text{min} \geqq 0 \text{ dB}$$

$$g1\text{max} \geqq 6 \text{ dB}$$

$$g1\text{min} < g1\text{max}$$

So long as the setpoint g remains between a minimum limit g1min equivalent to the low encoding and a maximum limit g1max equivalent to a high encoding, g1=g. The setpoint g1 is then converted 425 into a control setpoint $G1=e^{g1}$ used as a control setpoint for the analog AGC loop 402. The control of the power at the input of the CAN converter 401 is maintained by virtue of the analog AGC loop 402 and of the limits g1min and g1max allocated to its control setpoint. This makes it possible to prevent the saturation of the CAN converter in the event of narrowband interference that is too powerful and not visible at the output of the interference-suppressing filter 407.

In order to ensure a stable behavior of the two control loops in cascade, a different time constant can be used for the two AGC loops by choosing appropriate loop gains at the time of design of the correctors 405, 422. In a preferred embodiment, a rapid time constant is used for the analog AGC loop 402 while a slower constant is used for the digital AGC loop 420. Advantageously this makes it possible to improve the stability of the system.

The digital AGC loop 420 automatically sets the setpoint G1 of the analog AGC 402 so that the analog gain ga controlled on the setpoint gives a power of the signal at the output of the interference-suppressing filter that is equal to the control setpoint gn of the digital AGC loop.

If the power of the signal received by the system increases, the analog AGC loop 402 reacts immediately in order to compensate for the analog gain ga and the digital AGC 420 does not sense any change.

When a narrowband interference appears, it has the effect of increasing the total power at the output of the CAN converter 401. The analog AGC loop 402 reacts in the short term by reducing the analog gain ga 406. The signal at the output of the interference-suppressing filter 407, cleared of the narrowband interference, sees its power diminish. As a consequence, the digital AGC loop 420 will react in its turn by increasing the setpoint G1 of the analog AGC loop. It therefore appears that the analog gain ga will return to its initial value. Only the setpoint G1 of the analog AGC will have been modified.

When the value of the setpoint g determined by the digital loop 420 reaches the limits g1min and g1max corresponding respectively to the saturation and quantization margins, the analog setpoint g1 adapted by the saturation module 424 remains immobilized at one of these limit values g1min or g1max. This means that the digital AGC loop 420 has no more effect and that the power at the output of the interference-suppressing filter is no longer controlled. Advantageously, the phenomena of saturation and degradation of the signal-to-noise ratio due to the quantization noise are prevented.

Figure 6:
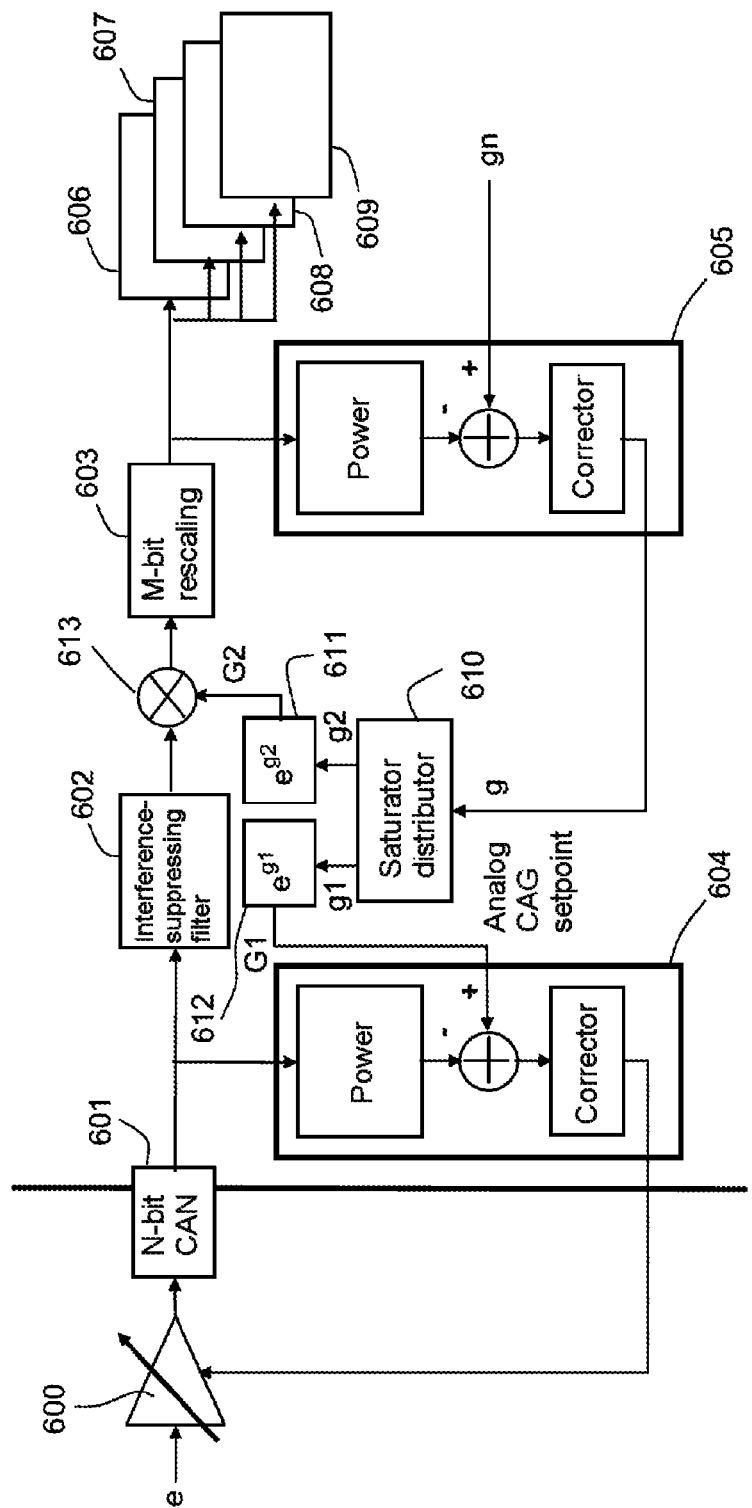
FIG. 6 shows a second embodiment of the analog-digital conversion system according to the invention.

FIG. 6 shows a second embodiment of the analog-digital conversion system according to the invention. The system consists of a transmission chain comprising an analog stage itself consisting of at least one variable gain amplifier 600. The object of this amplifier is to amplify an analog input signal e. After amplification, the signal is processed by a CAN converter 601 on N bits. The digitized signal at the output of the converter 601 is filtered with the aid of an interference-suppressing digital filter 602. The bits at the output of the filter are rescaled on M bits by a rescaling module 603. The digitized and rescaled signal is then used to demodulate 606, 607, 608, 609 the received communication channel(s).

As for the first embodiment, two AGC loops 604, 605 in cascade are also used. The first AGC loop 604 is a conventional analog AGC loop based on an estimate of the power at the output of the CAN converter 601. The second AGC loop 605 is a digital AGC loop based on an estimate of the power at the output of the interference-suppressing filter 602 and of which the object is to determine the control setpoint of the first loop.

The digital AGC loop 605 generates a setpoint g. This setpoint is, for example, adapted by a saturation module 610 in order to obtain two adapted control setpoints g1 and g2.

The adapted control setpoint g1 is determined by the saturation module 610 in the same way as in the first embodiment. g1 is then converted 612 into a setpoint $G1=e^{g1}$ used as a control setpoint of the analog AGC loop 604.

If the processings that follow the digital filter do not require many bits per signal sample, it is advantageous to reduce the number of bits M<N to the number that is strictly necessary in order to simplify the computations and hence reduce the volume, the cost and the consumption of the component(s) of the receiver. The digital AGC loop 605 is then used to adapt 613 the power of the signal after interference-suppressing filtering in the encoding window of the rescaling.

So as to take account of the saturation of the setpoint of g1, an adapted setpoint g2 is determined by the saturation module 610 based on the setpoint g. This adapted setpoint is converted 611 into a gain $G2=e^{g2}$, the gain G2 then being applied 613 to the signal at the output of the interference-suppressing filter.

Figure 7:
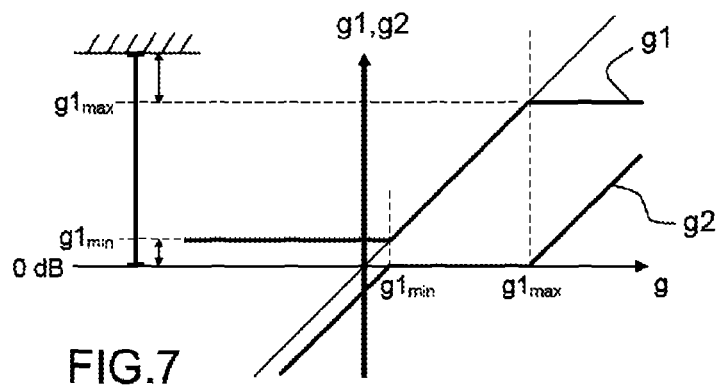
FIG. 7 shows how the control setpoints are used in the second embodiment.
Figure 3:
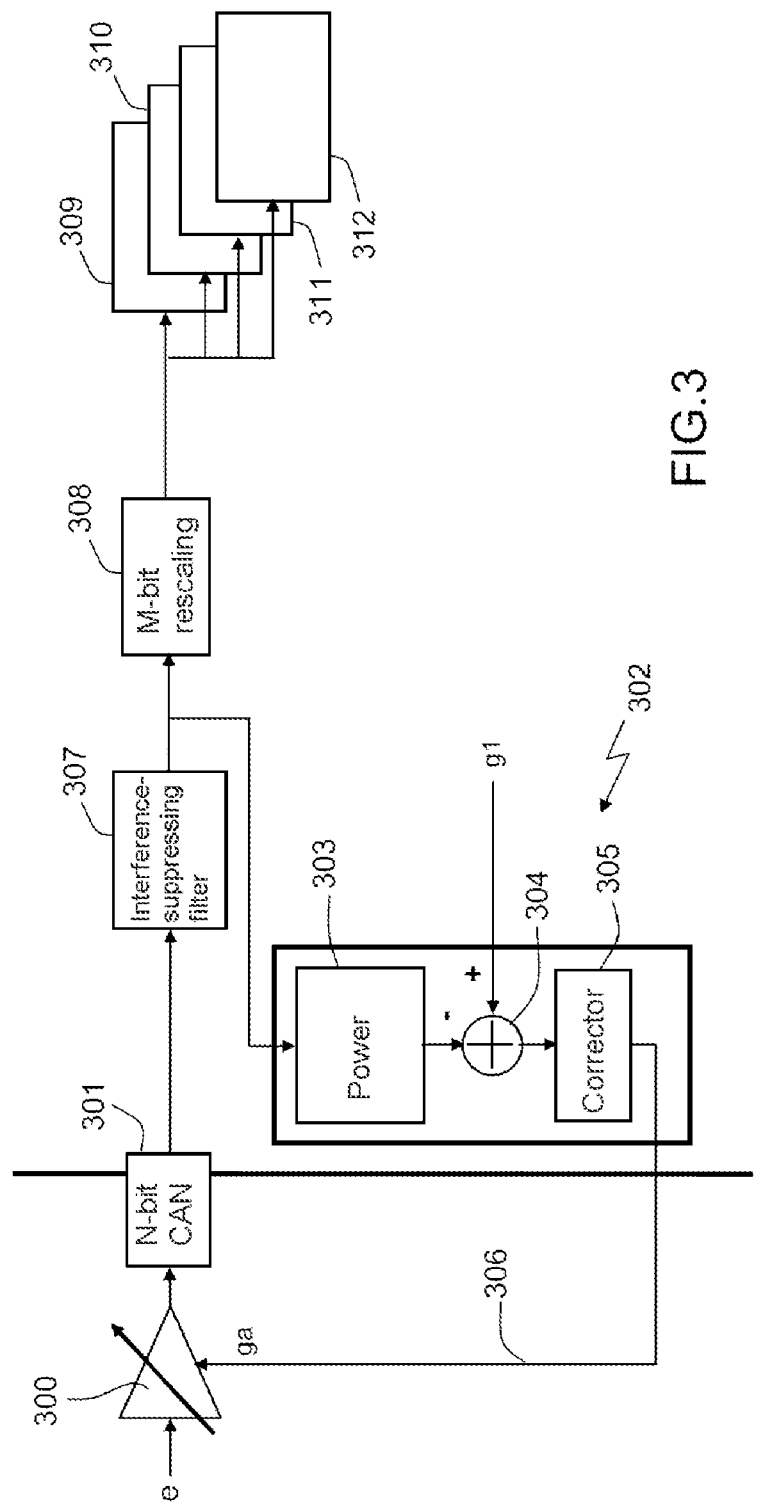
FIG. 3 illustrates an existing technique making it possible to prevent the phenomenon of amplification gain reduction in the presence of pulsed interference.

FIG. 7 shows how the control setpoints g1 and g2 used in the second embodiment can be determined. The control setpoint g1 is determined as described above with the aid of FIG. 5. The control setpoint g2 is determined based on g and g1 so that the following expression is verified:

$$g2=g-g1$$

Figure 8:
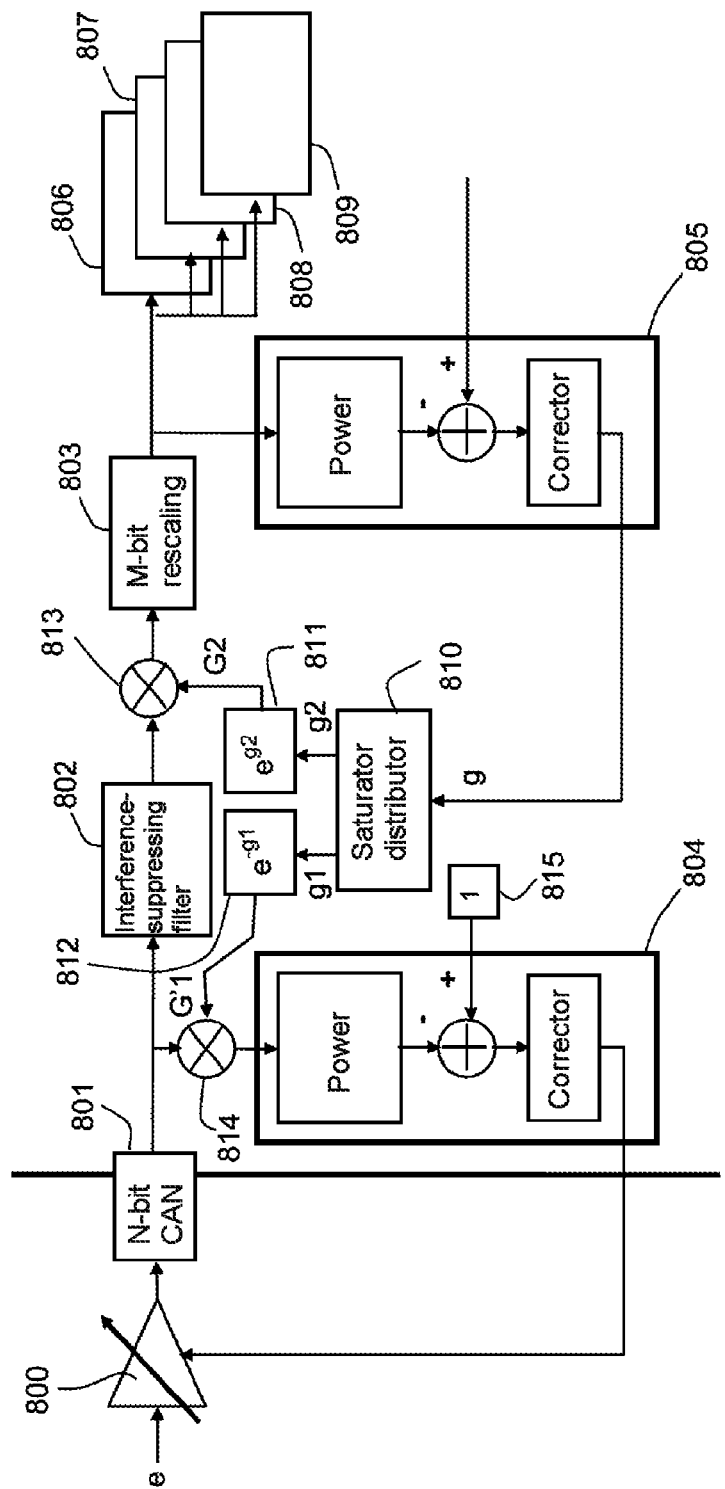
FIG. 8 shows a third embodiment of the analog-digital conversion system according to the invention.

FIG. 8 shows a third embodiment of the analog-digital conversion system according to the invention. The system consists of a transmission chain comprising an analog stage itself consisting of a variable gain amplifier 800. The objective of this amplifier is to amplify an analog input signal e. After amplification, the signal is processed by a CAN converter 801 on N bits. The digitized signal at the output of the converter 801 is filtered with the aid of an interference-suppressing digital filter 802. The bits at the output of the filter are rescaled 803 on M bits. The digitized and rescaled signal is then used to demodulate 806, 807, 808, 809 the received communication channel(s).

As for the first two embodiments, two AGC loops 804, 805 in cascade are used. The first AGC loop 804 is a conventional analog AGC loop based on the output of the CAN converter 801. The second AGC loop 805 is a digital AGC loop based on the output of the interference-suppressing filter 802. A saturation module 810 deduces from the control setpoint g of the digital AGC loop two adapted control setpoints g1 and g2 as described above with the aid of FIG. 7. A gain G2 is determined 812 based on the adapted setpoint g2 in the same way as for the second embodiment. The gain G2 is applied 813 to the signal at the output of the interference-suppressing digital filter 802. Unlike the second embodiment, a gain G1' is determined based on g1 so that G1'=exp(−g1) where the function exp( ) represents the exponential function. The digital gain G1' is applied 814 upstream of the power computation of the analog AGC loop 804. This has the effect of facilitating the implementation of the analog AGC loop 804 by limiting the number of bits required for the computations. This embodiment makes it possible to return to an unvarying time constant by virtue of a constant setpoint 815.

Thus, it appears that, in the context of the invention, the analog AGC loop can be controlled in two ways. The first way is to adapt the setpoint used for the comparison applied by the analog AGC loop and the second way is to apply a gain to the signal at the output of the CAN converter before estimation of power by the analog AGC loop.

Figure 9:
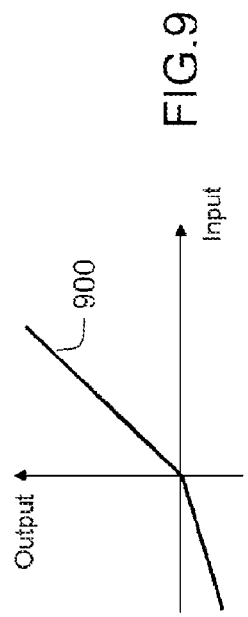
FIG. 9 gives an example of nonlinear function that can advantageously be used by a nonlinearity module.

In the presence of a large number of pulsed interferences in the useful band of the signal, the estimate of the power after the interference-suppressing filter can be skewed. The result of this may be an insufficient setpoint value g. This too low value of g may then cause the loss of the useful signal because of too high a rescaling. On the other hand, if the pulse excision technique called "blanking" is applied after the interference-suppressing filter, the reset threshold may be too high and allow too much interference to pass in the signal-processing channels. For the record, the "blanking" technique consists in resetting the signal when too high a power is detected, this power reflecting the presence of pulsed interference. In order to limit these drawbacks, one solution consists in introducing a nonlinearity before the corrector of the two AGC loops using nonlinearity modules, in order to give greater weight to the signal when the latter is not disrupted, that is to say when the estimated power is lower. FIG. 9 gives an example of nonlinearity that can be advantageously applied by the nonlinearity module. The curve 900 illustrates the relation between the input signal of the module and the output signal of the module.

Figure 10:
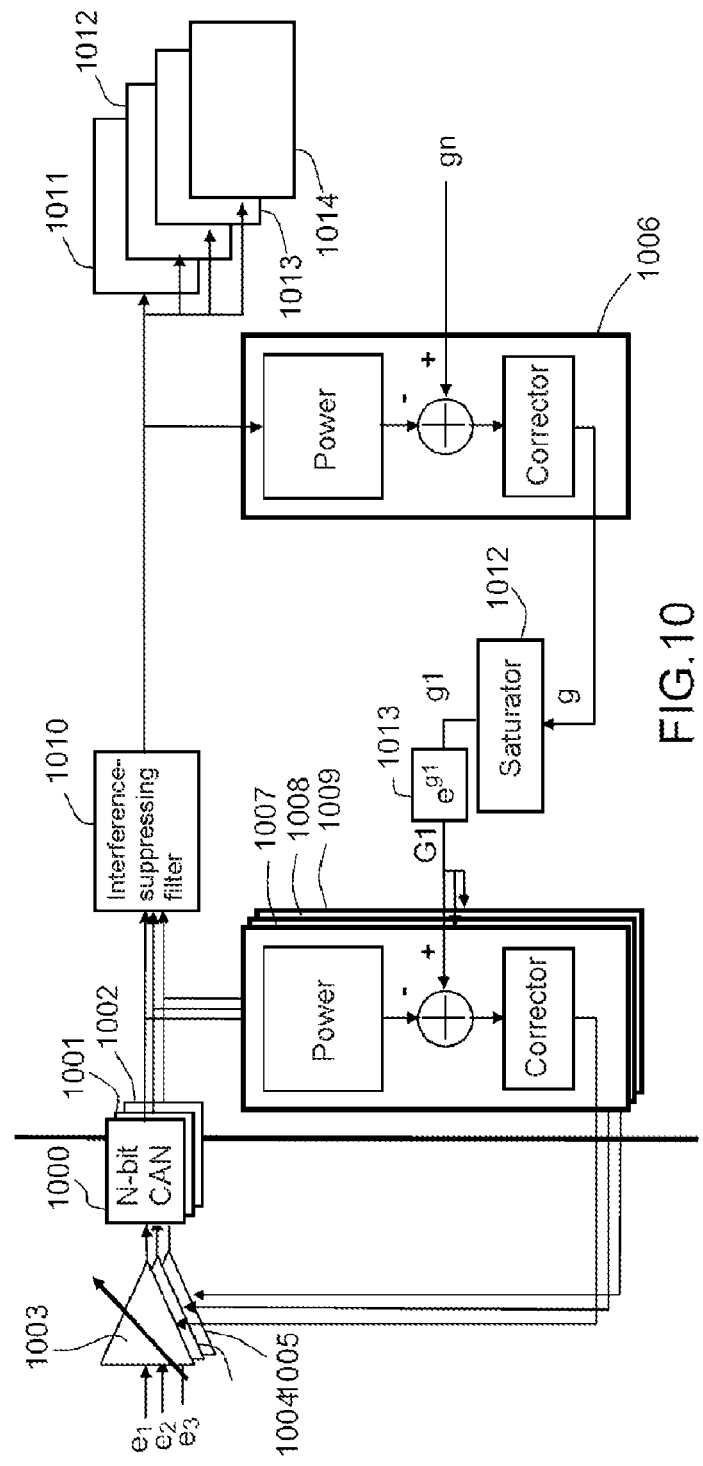
FIG. 10 shows another embodiment of the invention in the context of a multisensor architecture.

FIG. 10 shows a fourth embodiment of the invention in a multisensor architecture, specifically, the system according to the invention can be applied within a multisensor receiver, that is to say receiving several analog signals e1, e2, e3 on several antennas.

In this example, a three-sensor architecture is taken into account. The system consists of a transmission chain comprising an analog stage consisting of a variable gain amplifier 1003, 1004, 1005, one amplifier being allocated to one sensor. The objective of these amplifiers is to amplify the analog input signals e1, e2, e3. After amplification, the signals are processed by CAN converters 1000, 1001, 1002 operating on N bits. The digitized signals are processed by an interference-suppressing processing method 1010. The digital signal resulting from this processing, for example a weighted total of the antenna signals, is then used to demodulate 1011, 1012, 1013, 1014 the received communication channel(s). In this embodiment, a single digital AGC loop is used, said loop being based on an estimate of the mean power of the signal at the output of a weighted total of the antenna signals. For each sensor or antenna, an analog AGC loop 1007, 1008, 1009 associated with each CAN converter 1000, 1001, 1002 is used. One and the same control setpoint G1 resulting 1013 from a setpoint g1 adapted by a saturation module 1012 based on the control setpoint g of the digital AGC loop 1006 is used as a control setpoint for the analog AGC loops 1007, 1008, 1009.

A general comment concerns the conversion blocks 425, 611, 612, 811, 812, 1013 which are designed to convert values expressed in dB into linear values so that the setpoints can be used by the comparators or used as gains 613, 813, 814. The setpoint g at the output of the digital AGC is expressed in dB, that is to say on a logarithmic scale, so as to retain a time constant independent of the received power. In the same way, the analog gain control ga at the output of the analog AGC is expressed on a logarithmic scale, the variable gain amplifier awaiting a command in dB.

Advantageously, the various embodiments of the analog-digital conversion system according to the invention remain robust to all types of interference, narrow or broadband, pulsed or continuous. It is particularly effective for narrow-band pulsed interference relative to a system comprising a simple high-encoding AGC loop by allowing an effective digital filtering with no saturation or increase of quantization noise. Thus, the invention may advantageously be applied irrespective of the interference-suppressing digital processing used. This processing may, for example, be a digital filtering of the FIR type, an amplitude domain processing ADP, a spatial processing using a multisensor antenna or space-time adaptive processing STAP. Thus the fact that the embodiments of FIGS. 4, 6 and 8 use interference-suppressing digital filter processes must not be considered as a limitation to the scope of the invention.

The invention claimed is:

1. An analog-digital conversion system comprising at least one variable gain amplifier amplifying an input signal e, an analog-digital converter CAN digitizing said signal e, an interference-suppressing digital processing module for processing the digitized signal, a first automatic gain control AGC loop, being an analog AGC loop, comparing an estimate of the output power from the CAN converter with a control setpoint g1 being the control setpoint of the analog AGC loop, a gain ga used to control the variable gain amplifier being deduced from the comparison made by the first automatic gain control AGC loop, the system further comprising a second automatic gain control AGC loop, being a digital loop, said digital loop comparing an estimate of the power after the interference-suppressing digital processing with a predetermined control setpoint gn, the analog AGC loop being controlled by a control setpoint deduced from the comparison made by the second automatic gain control AGC loop.

2. An analog-digital conversion system according claim 1, wherein the power estimates used by the analog and digital AGC loops are mean power estimates.

3. An analog-digital conversion system according claim 1, wherein the control setpoint of the analog AGC loop is determined by the digital AGC loop using a corrector, said corrector applying a gain to the result of the comparison and incorporating the signal samples thus obtained and wherein the gain ga is determined by the analog AGC loop using a corrector, said corrector applying a gain to the result of the comparison and incorporating the signal samples thus obtained.

4. An analog-digital conversion system according to claim 3, wherein a different time constant is used for the two AGC loops, the time constant of the analog AGC loop being chosen to have a duration that is less than the time constant of the digital AGC loop.

5. An analog-digital conversion system according to claim 1, wherein a corrector determines a setpoint g, a saturation module adapting this setpoint so as to obtain the control setpoint of the analog AGC loop g1 adapted such that:

| | | |
|---|---|---|
| if $g \geq gmax$ | then | $g1 = g1max$ |
| if $g1min < g < g1max$, | then | $g1 = g$ |
| if $g \leq g1min$ | then | $g1 = g1min$ | expressions in which:
g1min corresponds to the quantization margin of the CAN converter; and
g1max corresponds to the saturation margin of the CAN converter.

6. An analog-digital conversion system according to claim 5, wherein the saturation module determines a second adapted setpoint g2 based on the setpoint g so that $g2=g-g1$, the gain g2 being applied to the output signal of the interference-suppressing digital processing.

7. An analog-digital conversion system according to claim 1, wherein a pulse excision module is used after the interference-suppressing digital processing.

8. An analog-digital conversion system according to claim 7, wherein a nonlinearity module is used in the analog AGC loop after comparison, said module having the function of giving more weight to the signal when the latter is not disrupted, that is to say when the estimated power is lower.

9. An analog-digital conversion system according to claim 7, wherein a nonlinearity module is used in the digital AGC loop after comparison, said module having the function of giving more weight to the signal when the latter is not disrupted, that is to say when the estimated power is lower.

10. An analog-digital conversion system according to claim 1, wherein several analog input signals e1, e2, e3 originating from several sensors are amplified and converted into digital signals, a variable gain amplifier and a CAN converter being associated with an input signal, said input signals, after having been amplified and digitized, being processed by an interference-suppressing digital processing module such that a signal resulting from a combination of the digitized signals is obtained, a digital AGC loop being used to determine a control setpoint G1 used by a plurality of analog AGC loops, an analog AGC loop being used for each input signal.

11. An analog-digital conversion system according to claim 1, wherein the interference-suppressing digital processing is a digital finite impulse response filter.

12. An analog-digital conversion system according to claim 1, wherein the interference-suppressing digital processing is an amplitude domain processing ADP.

13. An analog-digital conversion system according to claim 1, wherein the interference-suppressing digital processing is a spatial processing using a multi-sensor antenna or space-time adaptive processing STAP.

14. An analog-digital conversion system according to claim 1, wherein a rescaling module is used after the interference-suppressing digital processing.

15. An analog-digital conversion system according to claim 1, wherein the input signal is a broadband signal generated using the spread-spectrum technique.

16. An analog-digital conversion system comprising at least one variable gain amplifier amplifying an input signal e, an analog-digital converter CAN digitizing said signal e, an interference-suppressing digital processing of the digitized signal, a first automatic gain control AGC loop, being an analog AGC loop, comparing an estimate of the output power of the CAN converter with a control setpoint g1 being an analog AGC loop control setpoint, a gain ga used to control the variable gain amplifier being deduced from this comparison, and further comprising a second automatic gain control AGC loop called the digital loop, said digital loop comparing an estimate of the power after the interference-suppressing digital processing with a predetermined control setpoint gn, the analog AGC loop being controlled by applying a gain to the output signal of the CAN converter before estimation of the power of the signal, said gain being determined using said comparison.

* * * * *